United States Patent
Kotani et al.

(10) Patent No.: US 11,015,017 B2
(45) Date of Patent: May 25, 2021

(54) RESIN COMPOSITION FOR ENCAPSULATING SEMICONDUCTOR, SEMICONDUCTOR DEVICE, AND METHOD FOR PRODUCING RESIN COMPOSITION FOR ENCAPSULATING SEMICONDUCTOR

(71) Applicant: SUMITOMO BAKELITE CO., LTD., Tokyo (JP)

(72) Inventors: Takahiro Kotani, Tokyo (JP); Hiroshi Shibata, Tokyo (JP)

(73) Assignee: SUMITOMO BAKELITE CO., LTD., Tokyo (JP)

( * ) Notice: Subject to any disclaimer, the term of this patent is extended or adjusted under 35 U.S.C. 154(b) by 0 days.

(21) Appl. No.: 16/964,026

(22) PCT Filed: Jan. 30, 2019

(86) PCT No.: PCT/JP2019/003081
§ 371 (c)(1),
(2) Date: Jul. 22, 2020

(87) PCT Pub. No.: WO2019/155950
PCT Pub. Date: Aug. 15, 2019

(65) Prior Publication Data
US 2021/0002414 A1 Jan. 7, 2021

(30) Foreign Application Priority Data

Feb. 6, 2018 (JP) .............................. JP2018-018871
Feb. 6, 2018 (JP) .............................. JP2018-018872

(51) Int. Cl.
| | | |
|---|---|---|
| C08K 3/04 | (2006.01) | |
| C09C 1/60 | (2006.01) | |
| C08G 59/02 | (2006.01) | |
| C08K 3/22 | (2006.01) | |
| C08K 3/36 | (2006.01) | |
| H01L 23/29 | (2006.01) | |
| H01L 23/31 | (2006.01) | |

(52) U.S. Cl.
CPC ............. *C08G 59/022* (2013.01); *C08K 3/04* (2013.01); *C08K 3/22* (2013.01); *C08K 3/36* (2013.01); *H01L 23/295* (2013.01); *H01L 23/3107* (2013.01); *C08K 2003/2227* (2013.01); *C08K 2201/003* (2013.01); *C09C 1/60* (2013.01)

(58) Field of Classification Search
CPC ................ C08K 3/04; C09C 1/60; C09C 1/56
See application file for complete search history.

(56) References Cited

U.S. PATENT DOCUMENTS

| | | | | |
|---|---|---|---|---|
| 5,521,026 | A * | 5/1996 | Brochu | ................... H01M 4/04 429/307 |
| 7,959,726 | B2 | 6/2011 | Gaudet | |
| 8,258,207 | B2 | 9/2012 | Gaudet | |
| 9,136,194 | B2 | 9/2015 | Yoshida et al. | |
| 9,546,286 | B2 * | 1/2017 | Step | ................... G03G 15/0233 |
| 2004/0126665 | A1 * | 7/2004 | Sun | ................... H01M 10/0565 429/303 |
| 2006/0258794 | A1 | 11/2006 | Gaudet | |
| 2008/0247940 | A1 | 10/2008 | Toda | |
| 2011/0201743 | A1 | 8/2011 | Gaudet | |
| 2015/0054180 | A1 | 2/2015 | Yoshida et al. | |

FOREIGN PATENT DOCUMENTS

| | | |
|---|---|---|
| CN | 101001925 A | 7/2007 |
| CN | 101213263 A | 7/2008 |
| JP | 2000-7894 A | 1/2000 |
| JP | 2005-119197 A | 5/2005 |
| JP | 2005-120277 A | 5/2005 |
| JP | 2006-278959 A | 10/2006 |
| JP | 2007-67164 A | 3/2007 |
| JP | 2009-275110 A | 11/2009 |
| JP | 2013-1861 A | 1/2013 |
| JP | 2017-179129 A | 10/2017 |
| WO | WO 2013/136685 A1 | 9/2013 |

OTHER PUBLICATIONS

International Search Report, issued in PCT/JP2019/003081, PCT/ISA/210, dated Apr. 16, 2019.
Written Opinion of the International Searching Authority, issued in PCT/JP2019/003081, PCT/ISA/237, dated Apr. 16, 2019.

* cited by examiner

*Primary Examiner* — Vickey Nerangis
(74) *Attorney, Agent, or Firm* — Birch, Stewart, Kolasch & Birch, LLP

(57) ABSTRACT

The resin composition for encapsulating semiconductor of the present invention is a resin composition for encapsulating semiconductor including an epoxy resin, a curing agent, an inorganic filler, and carbon black fine particles, in which when the resin composition for encapsulating semiconductor is injection-molded to have a length of 80 mm, a width of 10 mm and a thickness of 4 mm under conditions of a mold temperature of 175° C., an injection pressure of 10 MPa, and a curing time of 120 seconds, and then heated at 175° C. for 4 hours to obtain a cured product, and then a surface of the obtained cured product is observed with a fluorescence microscope, a maximum particle diameter of aggregates of the carbon black fine particles is 50 μm or less.

6 Claims, 1 Drawing Sheet

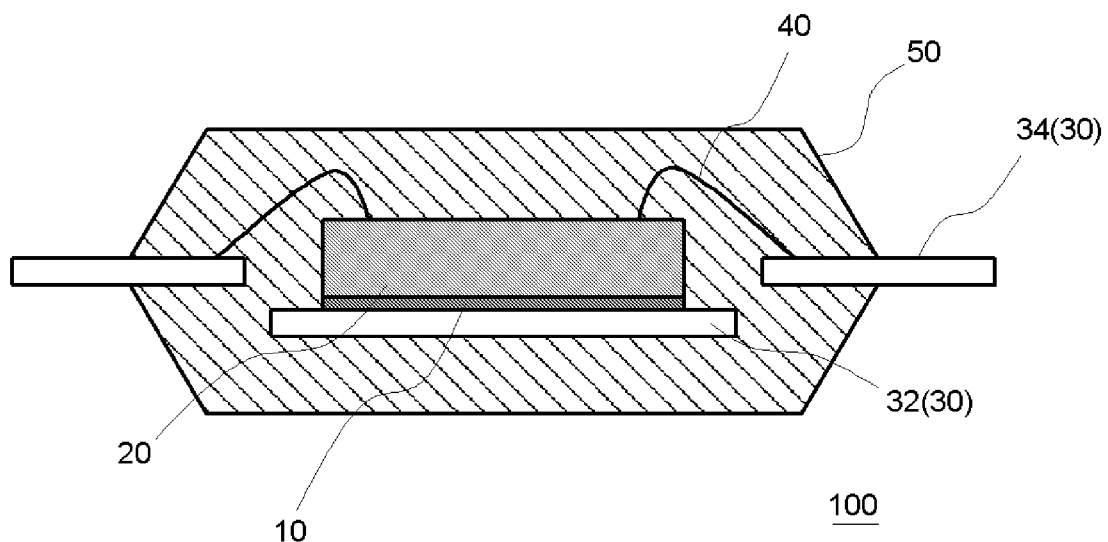

RESIN COMPOSITION FOR ENCAPSULATING SEMICONDUCTOR, SEMICONDUCTOR DEVICE, AND METHOD FOR PRODUCING RESIN COMPOSITION FOR ENCAPSULATING SEMICONDUCTOR

TECHNICAL FIELD

The present invention relates to a resin composition for encapsulating semiconductor, a semiconductor device, and a method for producing a resin composition for encapsulating semiconductor.

BACKGROUND ART

For example, as shown in Patent Document 1, carbon black is formulated in the field of resin compositions for encapsulating semiconductor. Thus, in a case of marking information such as a product name and a lot number on a cured product of a resin composition for encapsulating semiconductor, it is possible to perform printing more clearly. In addition, light is absorbed by the carbon black, light transmission is prevented, and thus an action of preventing malfunction of a semiconductor element due to the light is exhibited.

RELATED DOCUMENT

Patent Document

[Patent Document 1] Japanese Laid-open patent publication NO. 2009-275110

SUMMARY OF THE INVENTION

Technical Problem

For example, in the field of semiconductor devices adopting a lead frame, in order to improve the performance of the semiconductor device, it is required to reduce an interval between bonding wires used for connecting the electronic element and the lead frame.

The present inventors have found that in a case where a semiconductor device is prepared using a resin composition for encapsulation described in Patent Document 1, a short circuit may occur and the electrical reliability of the semiconductor device may be reduced.

An object of the present invention is to provide a resin composition for encapsulating semiconductor capable of improving electrical reliability when a semiconductor device is produced.

Solution to Problem

The present inventors have investigated the cause of a short circuit in order to improve the electrical reliability of a semiconductor device. As a result, it has been found that aggregates of carbon black, that is, carbon aggregates, are clogged between bonding wires having a narrow interval, which causes a short circuit.

Here, the present inventors have found that by setting the maximum particle diameter of the aggregate of carbon black included in the resin composition for encapsulating semiconductor to a specific numerical value or less to control the occurrence of clogging of the aggregates of carbon black between the bonding wires, the electrical reliability of the semiconductor device can be improved, and thus have completed the present invention.

According to the present invention, there is provided a resin composition for encapsulating semiconductor comprising:

an epoxy resin;
a curing agent;
an inorganic filler; and
carbon black fine particles, in which when the resin composition for encapsulating semiconductor is injection-molded to have a length of 80 mm, a width of 10 mm and a thickness of 4 mm under conditions of a mold temperature of 175° C., an injection pressure of 10 MPa, and a curing time of 120 seconds, and then heated at 175° C. for 4 hours to obtain a cured product, and then a surface of the obtained cured product is observed with a fluorescence microscope, a maximum particle diameter of aggregates of the carbon black fine particles is 50 μm or less.

In addition, according to the present invention, there is provided a semiconductor device including:

a semiconductor element that is mounted over a substrate; and an encapsulating member that encapsulates the semiconductor element, in which the encapsulating member is constituted of a cured product of the resin composition for encapsulating semiconductor.

Further, according to the present invention, there is provided a method for producing a resin composition for encapsulating semiconductor, the method including:

a step of mixing carbon black and an inorganic filler to obtain a mixture, and pulverizing the mixture by jet milling to pulverize the carbon black so as to obtain carbon black fine particles; and a step of mixing an epoxy resin, a curing agent, an inorganic filler, and the carbon black fine particles to obtain a resin composition for encapsulating semiconductor.

Advantageous Effects of Invention

According to the present invention, there are provided a resin composition for encapsulating semiconductor capable of improving electrical reliability when a semiconductor device is produced, a semiconductor device including a cured product of the resin composition, and a method for producing the resin composition for encapsulating semiconductor.

BRIEF DESCRIPTION OF THE DRAWINGS

The above and other objects, features and advantages will become more apparent from the following description of preferred embodiments taken in conjunction with the following accompanying drawings.

FIG. 1 is an example of a cross-sectional view of a semiconductor device according to an embodiment.

DESCRIPTION OF EMBODIMENTS

Hereinafter, embodiments of the present invention will be described using the drawings. In addition, in all the drawings, the same constitutional components are denoted by the same reference numerals, and description thereof will not be repeated.

A resin composition for encapsulating semiconductor according to an embodiment (hereinafter, also referred to as a "resin composition for encapsulation" or "resin composition") is a resin composition for encapsulating semiconductor including an epoxy resin, a curing agent, an inorganic filler, and carbon black fine particles. When the resin composition for encapsulating semiconductor is injection-molded to have a length of 80 mm, a width of 10 mm, and a thickness of 4 mm under the conditions of a mold temperature of 175° C., an injection pressure of 10 MPa, and a curing time of 120 seconds and then heated at 175° C. for 4 hours to obtain a cured product, and then the surface of the cured product is observed with a fluorescence microscope, the maximum particle diameter of aggregates of the carbon black fine particles is 50 μm or less.

The present inventors have investigated the cause of a short circuit in order to improve the electrical reliability of a semiconductor device. As a result, it has been found that the aggregates of carbon black, that is, carbon aggregates, are clogged between the bonding wires having a small interval, which causes a short circuit. Therefore, the present inventors have found that when the maximum particle diameter of the aggregates of carbon black included in the resin composition for encapsulation is set to a specific numerical value or less, the electrical reliability of a semiconductor device can be improved. Although the detailed mechanism is not clear, it is presumed that even in a case where the size of the carbon aggregates is reduced by setting the maximum particle diameter of the aggregates of the carbon black to a specific numerical value or less to make the interval between the bonding wires narrow, the carbon aggregates can be prevented from causing a short circuit.

From the above, it is presumed that the resin composition for encapsulating semiconductor according to the embodiment can improve the electrical reliability when a semiconductor device is produced.

(Resin Composition for Encapsulating Semiconductor)

First, the resin composition for encapsulating semiconductor according to the embodiment will be described.

The upper limit of the maximum particle diameter of the aggregates of carbon black fine particles when the resin composition for encapsulation according to the embodiment is cured to form a cured product is 50 μm or less, for example, preferably 40 μm or less, more preferably 30 μm or less, even more preferably 25 μm or less, and still even more preferably 20 μm or less. Thus, the carbon aggregates can be prevented from causing a short circuit by reducing the size of the carbon aggregates.

The lower limit of the maximum particle diameter of the aggregates of the carbon black fine particles when the resin composition for encapsulation according to the embodiment is cured to form a cured product may be, for example, 0.1 μm or more, or 1 μm or more. Basically, it is preferable that the carbon black fine particles are highly dispersed from the viewpoint of improving electrical reliability.

In the embodiment, the maximum particle diameter of the aggregates of the carbon black fine particles when the resin composition for encapsulation is cured to form a cured product can be measured as follows.

First, for example, the resin composition for encapsulation is injection-molded to have a length of 80 mm, a width of 10 mm, and a thickness of 4 mm under the conditions of a mold temperature of 175° C., an injection pressure of 10 MPa, and a curing time of 120 seconds using a low pressure transfer molding machine, and then heated at 175° C. for 4 hours to prepare a cured product. The surface of the cured product of the resin composition for encapsulation is observed with a fluorescence microscope to evaluate the maximum particle diameter of the aggregates of the carbon black fine particles. The maximum particle diameter of the carbon aggregates is the maximum value of the particle size of the carbon aggregates in the observed region. The particle diameter of the carbon aggregate is measured by taking the maximum length when two arbitrary points in a certain carbon aggregate are connected as the particle diameter.

In the resin composition for encapsulation in the related art, aggregates are crushed by pulverizing the carbon black by jet milling. However, the carbon black has excellent mechanical properties, and coarse aggregates cannot be completely removed only by jet milling.

In the embodiment, by devising a method for pulverizing carbon black, the maximum particle diameter of aggregates of carbon black fine particles to be obtained can be controlled within a desired numerical range. A method for pulverizing carbon black to produce carbon black fine particles will be described in detail below, but a method in which carbon black and an inorganic filler are mixed to prepare a mixture and the mixture is pulverized by jet milling is used. Although the detailed mechanism is not clear, it is presumed that by mixing carbon black and an inorganic filler having hardness higher than that of the carbon black, the inorganic filler can crush the carbon black and crush reaggregated coarse carbon aggregates. Thus, the maximum particle diameter of the carbon black can be controlled within a desired numerical range.

In the method for pulverizing the carbon black, it is important to control factors such as the properties of the inorganic filler such as the kind, particle diameter, specific surface area, and Mohs hardness of the inorganic filler; the content of the inorganic filler and the carbon black in the mixture; the average particle diameter of the carbon black aggregates in the mixture; and the amount of the mixture to be fed and the gas pressure in the jet mill pulverization for pulverizing the carbon black to realize the desired maximum particle diameter.

Further, as a method for controlling the maximum particle diameter of the aggregate of the carbon black within the desired numerical range, it is also effective to control the maximum particle diameter of the carbon black by performing, for example, two-step pulverization in which first, jet mill pulverization by the carbon black is performed, and then the carbon black and the inorganic filler are mixed and pulverized by jet milling.

The resin composition for encapsulation according to the embodiment includes an epoxy resin, a curing agent, an inorganic filler, and carbon black fine particles.

The raw material components of the resin composition for encapsulation according to the embodiment will be described below.

(Epoxy Resin)

The epoxy resin represents a compound (monomer, oligomer or polymer) having two or more epoxy groups in one molecule, and the molecular weight and the molecular structure thereof are not limited.

Specific examples of the epoxy resin include crystalline epoxy resins such as a biphenyl type epoxy resin, a bisphenol type epoxy resin such as a bisphenol A type epoxy resin, and a stilbene type epoxy resin; novolac type epoxy resins such as a phenol novolac type epoxy resin, and a cresol novolac type epoxy resin; polyfunctional epoxy resins such as a triphenolmethane type epoxy resin, and an alkyl modified triphenolmethane type epoxy resin; phenol aralkyl type epoxy resins such as a phenol aralkyl type epoxy resin containing a phenylene skeleton, and a phenol aralkyl type epoxy resin containing a biphenylene skeleton; naphthol type epoxy resins such as a dihydroxynaphthalene type epoxy resin, and an epoxy resin obtained by glycidyl etherification of a dimer of dihydroxynaphthalene; triazine nucleus-containing epoxy resins such as triglycidyl isocyanurate, and monoallyl diglycidyl isocyanurate; and bridged cyclic hydrocarbon compound modified phenol type epoxy resins such as a dicyclopentadiene modified phenol type epoxy resin. As the epoxy resin, one of the above specific examples can be used or two or more thereof can be used in combination.

As the epoxy resin, it is preferable to use, for example, a phenol aralkyl type epoxy resin or a bisphenol type epoxy resin among the above specific examples. Thus, the carbon black fine particles can be suitably dispersed in the resin composition for encapsulation, and the electrical reliability when a semiconductor device is produced can be improved.

The lower limit of the content of the epoxy resin in the resin composition for encapsulation is, for example, preferably 0.1 part by mass or more, more preferably 0.3 parts by mass or more, and even more preferably 0.5 parts by mass or more with respect to 100 parts by mass of the solid content of the resin composition for encapsulation.

The upper limit of the content of the epoxy resin in the resin composition for encapsulation is, for example, preferably 20 parts by mass or less, more preferably 15 parts by mass or less, and even more preferably 10 parts by mass or less with respect to 100 parts by mass of the solid content of the resin composition for encapsulation.

By setting the content of the epoxy resin in the resin composition for encapsulation to be within the above numerical range, the carbon black fine particles can be suitably dispersed in the resin composition for encapsulation and the electrical reliability when a semiconductor device is produced can be improved.

(Curing Agent)

As the curing agent, a known curing agent can be selected according to the kind of epoxy resin. Specific examples of the curing agent include a polyaddition type curing agent, a catalyst type curing agent, and a condensation type curing agent.

Specific examples of the polyaddition type curing agent include aliphatic polyamines such as diethylenetriamine (DETA), triethylenetetramine (TETA), and metaxylylenediamine (MXDA); aromatic polyamines such as diaminodiphenylmethane (DDM), m-phenylenediamine (MPDA), and diaminodiphenylsulfone (DDS); polyamine compounds including dicyandiamide (DICY), and organic acid dihydrazide; acid anhydrides including alicyclic acid anhydrides such as hexahydrophthalic anhydride (HHPA), and methyltetrahydrophthalic anhydride (MTHPA); aromatic acid anhydrides such as trimellitic anhydride (TMA), pyromellitic anhydride (PMDA), and benzophenonetetracarboxylic dianhydride(BTDA); phenol resin-based curing agents such as a novolac type phenol resin, a polyvinylphenol, and an aralkyl type phenol resin; polymercaptan compounds such as a polysulfide, a thioester, and a thioether; isocyanate compounds such as an isocyanate prepolymer, and a blocked isocyanate; and organic acids such as a carboxylic acid-containing polyester resin. As the polyaddition type curing agent, one of the above specific examples can be used or two or more thereof can be used in combination.

Specific examples of the catalyst type curing agent include tertiary amine compounds such as benzyldimethylamine (BDMA), and 2,4,6-trisdimethylaminomethylphenol (DMP-30); imidazole compounds such as 2-methylimidazole, and 2-ethyl-4-methylimidazole (EMI24); and Lewis acids such as $BF_3$ complexes. As the catalyst type curing agent, one of the above specific examples can be used or two or more thereof can be used in combination.

Specific examples of the condensation type curing agent include resol type phenol resins; urea resins such as a methylol group-containing urea resin; and melamine resins such as a methylol group-containing melamine resin. As the condensation type curing agent, one of the above specific examples can be used or two or more thereof can be used in combination.

It is preferable that the resin composition includes a phenol resin-based curing agent among the above specific examples as the curing agent.

As the phenol resin-based curing agent, all of monomers, oligomers, and polymers, each having two or more phenolic hydroxyl groups in one molecule, can be used, and molecular weights and molecular structures thereof are not limited.

Specific examples of the phenol resin-based curing agent include phenol novolac type resins such as a phenol novolac resin, a cresol novolac resin, bisphenol novolac resin, and a phenol biphenyl novolac resin; polyvinyl phenol; polyfunctional type phenol resins such as a triphenolmethane type phenol resin; modified phenol resins such as a terpene-modified phenol resin and a dicyclopentadiene-modified phenol resin; phenol aralkyl type phenol resins such as a phenol aralkyl resin containing a phenylene skeleton and/or a biphenylene skeleton, and a naphthol aralkyl resin containing a phenylene and/or a biphenylene skeleton; and bisphenol compounds such as bisphenol A and bisphenol F. As the phenol resin-based curing agent, one of the above specific examples can be used or two or more thereof can be used in combination.

Among the above specific examples, it is preferable that the resin composition includes a phenol aralkyl resin containing a phenylene skeleton and/or a biphenylene skeleton as the phenol resin-based curing agent. Thus, in the resin composition for encapsulation, an epoxy resin can be satisfactorily cured. Therefore, it is possible to suppress the generation of coarse aggregates of the carbon black fine particles due to insufficient curing.

The lower limit of the content of the curing agent in the resin composition for encapsulation is, for example, preferably 0.5 part by mass or more, more preferably 1 part by mass or more, even more preferably 1.5 parts by mass or more, and still even more preferably 2 parts by mass or more with respect to 100 parts by mass of the solid content of the resin composition for encapsulation.

The upper limit of the content of the curing agent in resin composition for encapsulation is, for example, preferably 10 parts by mass or less, more preferably 8 parts by mass or less, even more preferably 6 parts by mass or less, and still even more preferably 5 parts by mass or less with respect to 100 parts by mass of the solid content of the resin composition for encapsulation.

By setting the content of the curing agent in the resin composition for encapsulation to be within the above numerical range, the epoxy resin can be satisfactorily cured. Therefore, it is possible to suppress the generation of coarse aggregates of the carbon black fine particles due to insufficient curing.

(Inorganic Filler)

The resin composition for encapsulation according to the embodiment includes an inorganic filler. The carbon black, which will be described later, can be pulverized by this inorganic filler. The resin composition for encapsulation according to the embodiment may contain, for example, an inorganic filler that is not used for pulverization, in addition to the inorganic filler that is used for pulverization.

The inorganic filler is not limited, and specific examples thereof include inorganic oxides, inorganic nitrides, inorganic carbides, and inorganic hydroxides.

Specific examples of the inorganic oxides include silica, alumina, titanium oxide, talc, clay, mica, and glass fiber (quartz glass). Specific examples of silica include fused crushed silica, fused spherical silica, crystalline silica, secondary aggregated silica, and fine powder silica.

Specific examples of the inorganic nitrides include silicon nitride, aluminum nitride, and boron nitride.

Specific examples of the inorganic carbides include silicon carbide, zirconium carbide, titanium carbide, boron carbide, and tantalum carbide.

Specific examples of the inorganic hydroxides include aluminum hydroxide and magnesium hydroxide.

As the inorganic filler, among the above specific examples, it is preferable to use, for example, an inorganic oxide or an inorganic hydroxide, and it is more preferable to use one or more selected from the group consisting of silica, alumina and aluminum hydroxide. Thus, the carbon black and the inorganic filler collide with each other by pulverizing the mixture of the inorganic filler and the carbon black by jet milling and thus the carbon black can be finely pulverized. Therefore, the maximum particle diameter can be set within a desired numerical range.

The lower limit of the particle diameter $D_{50}$ at which the cumulative frequency of the volume-based particle size distribution of the inorganic filler according to the embodiment is 50% is, for example, preferably 0.1 μm or more, more preferably 0.5 μm or more, and even more preferably 1.0 μm or more. Therefore, in the pulverization step, the carbon black can be pulverized by the collision of the inorganic filler with the carbon black, and thus the carbon black having a suitable maximum particle diameter can be obtained.

In addition, the upper limit of the particle diameter $D_{50}$ at which the cumulative frequency of the volume-based particle size distribution of the inorganic filler according to the embodiment is 50% is, for example, preferably 100 μm or less, more preferably 75 μm or less, and even more preferably 50 μm or less. Therefore, in the pulverization step, the frequency with which the inorganic filler collides with the carbon black can be increased. Accordingly, the carbon black can be suitably pulverized.

The lower limit of the specific surface area of the inorganic filler according to the embodiment is, for example, preferably 0.1 $m^2/g$ or more, more preferably 0.5 $m^2/g$ or more, and even more preferably 1.0 $m^2/g$ or more. Therefore, the frequency of contact between the inorganic filler and the carbon black in the pulverization step is increased, so that the carbon black can be suitably pulverized.

The upper limit of the specific surface area of the inorganic filler according to the embodiment may be, for example, 10 $m^2/g$ or less, or 8 $m^2/g$ or less.

The lower limit of the Mohs hardness of the inorganic filler according to the embodiment is, for example, preferably 2 or more, and more preferably 3 or more. Thereby, in a case where the inorganic filler collides with the carbon black in the pulverization step, the carbon black can be suitably pulverized. The Mohs hardness of the carbon black is, for example, 0.5 or more and 1 or less.

The upper limit of the Mohs hardness of the inorganic filler according to the embodiment is, for example, 10 or less, and may be 9 or less.

(Carbon Black Fine Particles)

The carbon black used as the carbon black fine particles according to the embodiment is not limited, and specifically, carbon black such as furnace black, channel black, thermal black, acetylene black, Ketjen black, and lamp black can be used.

The upper limit of the particle diameter $D_{50}$ (that is, the secondary particle diameter) at which the cumulative frequency of the volume-based particle size distribution of the aggregates of the carbon black fine particles used in the resin composition of the embodiment is 50% is, for example, preferably 25 μm or less, more preferably 20 μm or less, even more preferably 15 μm or less, still even more preferably 10 μm or less, and particularly preferably 7 μm or less. Thus, even in a case of using the carbon black fine particles for the resin composition for encapsulation according to the embodiment, it is possible to prevent a short circuit in a semiconductor device.

In addition, the lower limit of the particle diameter $D_{50}$ at which the cumulative frequency of the volume-based particle size distribution of the aggregates of the carbon black fine particles according to the embodiment is 50% may be, for example, 0.01 μm or more, and 0.1 μm or more. In order to improve electrical reliability, it is preferable that the average particle diameter of the carbon black fine particles is small, but since the average particle diameter is equal to or greater than the above lower limit, the handleability of the carbon black fine particles can be improved.

The lower limit of the content of the carbon black fine particles in the resin composition for encapsulation is, for example, preferably 0.10 parts by mass or more, more preferably 0.20 parts by mass or more, and even more preferably 0.25 parts by mass or more with respect to 100 parts by mass of the solid content of the resin composition for encapsulation. Thus, a semiconductor device according to an embodiment is preferable from the viewpoint of being capable of more clearly performing printing in a case of marking information such as a product name and a lot number on the cured product of the resin composition for encapsulation while suppressing the formation of carbon aggregates. It is also preferable from the viewpoint of being capable of preventing light transmission and suppressing the malfunction of a semiconductor element due to light.

In addition, the upper limit of the content of the carbon black fine particles in the resin composition for encapsulation is, for example, preferably 2.0 parts by mass or less, more preferably 1.5 parts by mass or less, even more preferably 1.0 parts by mass or less, and still even more preferably 0.5 parts by mass or less with respect to 100 parts by mass of the solid content of the resin composition for encapsulation. The carbon black fine particles according to the embodiment are finer than conventional colorants. Therefore, even in a case where the content is as small as the lower limit or less, the coloring ability can be maintained, and thus this case is suitable. Further, it is preferable that the content is equal to or less than the lower limit value from the viewpoint of being capable of improving the electrical reliability of the semiconductor device.

As described above, it is important to devise the method for pulverizing the carbon black in order to set the maximum particle diameter of the aggregates of the carbon black fine particles in the resin composition for encapsulation according to the embodiment to be within the desired numerical range. Therefore, a method for producing the carbon black fine particles will be described below.

(Method for Producing Carbon Black Fine Particles)

The method for producing the carbon black fine particles according to the embodiment includes a mixing step of preparing a mixture obtained by mixing carbon black and an inorganic filler, and a pulverization step of pulverizing the mixture by jet milling to pulverize the carbon black.

Further, for example, the method for producing the carbon black fine particles according to the embodiment may further include a pre-pulverization step of pulverizing the carbon black alone by jet milling before the mixing step.

Hereinafter, the details of each step will be described.

(Mixing Step)

In the mixing step, a mixture of carbon black and the above-mentioned inorganic filler is prepared.

The mixing method is not limited as long as the carbon black and the inorganic filler are uniformly mixed. As the mixing method, specifically, a mixer or the like can be used.

The lower limit of the particle diameter $D_{50}$ at which the cumulative frequency of the volume-based particle size distribution of the carbon black aggregates in the mixture is 50% is, for example, preferably 6 µm or more, and more preferably 10 µm or more. According to the method for producing the carbon black fine particles according to the embodiment, from the viewpoint that the carbon black having a particle diameter $D_{50}$ of the above lower limit or more, which cannot be pulverized by the conventional method, can be finely pulverized, the method is preferable.

The upper limit of the particle diameter $D_{50}$ at which the cumulative frequency of the volume-based particle size distribution of the carbon black aggregates in the mixture is 50% may be, for example, 500 µm or less, or may be 300 µm or less. Thus, it is possible to make the dispersion of the carbon black and the inorganic filler in the mixture uniform. Accordingly, in the pulverization step, the carbon black can be uniformly pulverized, and the maximum particle diameter of the carbon aggregates can be set to be within the desired numerical range.

In a case where the particle diameter $D_{50}$ at which the cumulative frequency of the volume-based particle size distribution of the carbon black in the mixture is 50% is set as A, and the particle diameter $D_{50}$ at which the cumulative frequency of the volume-based particle size distribution of the inorganic filler in the mixture is 50% is set as B, the lower limit of A/B is, for example, preferably 0.1 or more, more preferably 0.2 or more, and even more preferably 0.3 or more. Thus, in the pulverization step, the inorganic filler can suitably collide with the coarse carbon black, and fine carbon black having a smaller particle diameter can be obtained.

The upper limit of A/B is, for example, preferably 200 or less, more preferably 75 or less, and even more preferably 150 or less. Thus, in the pulverization step, the inorganic filler collides with the coarse carbon black, so that an appropriate impact can be applied to the carbon black to pulverize the carbon black. Therefore, carbon black fine particles having a smaller particle diameter can be obtained.

The lower limit of the content of the inorganic filler in the mixture is, for example, preferably 5 parts by mass or more, more preferably 8 parts by mass or more, and even more preferably 10 parts by mass or more with respect to 100 parts by mass of the carbon black in the mixture.

In addition, the upper limit of the content of the inorganic filler in the mixture is, for example, preferably 2000 parts by mass or less, more preferably 1300 parts by mass or less, and even more preferably 1000 parts by mass or less with respect to 100 parts by mass of the carbon black in the mixture.

By setting the content of the inorganic filler to be within the above numerical range, the inorganic filler can appropriately collide with the carbon black to pulverize the carbon black.

(Pulverization Step)

In the pulverization step, the mixture is pulverized by jet milling to pulverize the carbon black. Thus, carbon black fine particles can be obtained.

As the method for jet mill pulverization, a conventionally known method can be used. Specific examples of the method for jet mill pulverization include a wall collision type jet mill and an air flow type jet mill such as a powder collision type jet mill. As the method for jet mill pulverization, for example, among the above specific examples, it is preferable to use an air flow type jet mill. Thus, it is possible to cause the inorganic filler and the carbon black to suitably collide with each other. Accordingly, the coarse carbon black can be finely pulverized.

An apparatus for performing jet mill pulverization may include devices associated with a jet mill, such as a constant amount feeder for feeding a fixed amount of the mixture to the jet mill and a filter device such as a bag filter.

For example, coarse carbon black can be further finely pulverized by appropriately adjusting the amount of the mixture to be fed from the constant amount feeder to the jet mill and the gas pressure to be fed to the jet mill.

(Pre-Pulverization Step)

The method for producing the carbon black fine particles according to the embodiment may further include, for example, a pre-pulverization step of pulverizing the carbon black alone by jet milling before the mixing step.

By pulverizing the carbon black by jet milling in the pre-pulverization step, the carbon black and the inorganic filler in the mixture can be more uniformly dispersed. Accordingly, coarse carbon black can be finely pulverized by the jet mill pulverization.

The method for jet mill pulverization in the pre-pulverization step is not limited, and for example, the same method as in the above-described pulverization step can be used.

(Other Components)

In the resin composition for encapsulation, as necessary, one or two or more of various additives such as a coupling agent, a fluidity imparting agent, a release agent, an ion scavenger, a curing accelerator, a low stress agent, a colorant, and a flame retardant can be appropriately formulated.

The representative components will be described below.

(Coupling Agent)

Specific examples of the coupling agent include vinyl silanes such as vinyltrimethoxysilane and vinyltriethoxysilane; epoxy silanes such as 2-(3,4-epoxycyclohexyl)ethyltrimethoxysilane, 3-glycidoxypropylmethyldimethoxysilane, 3-glycidoxypropyltrimethoxysilane, 3-glycidoxypropylmethyldiethoxysilane, and 3-glycidoxypropyltriethoxysilane; styryl silanes such as p-styryltrimethoxysilane; methacrylic silanes such as 3-methacryloxypropylmethyldimethoxysilane, 3-methacryloxypropyltrimethoxysilane, 3-methacryloxypropylmethyldiethoxysilane, and 3-methacryloxypropyltriethoxysilane; acrylic silanes such as 3-acryloxypropyltrimethoxysilane; amino silanes such as N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, and phenylaminopropyltrimethoxysilane; ureido silanes such as isocyanurate silane, alkyl silane, and 3-ureidopropyltrialkoxy silane; mercapto silanes such as 3-mercaptopropylmethyldimethoxysilane, and 3-mercaptopropyltrimethoxysilane; isocyanate silanes such as 3-isocyanatopropyltriethoxysilane; titanium-based compounds; aluminum chelates; and aluminum/zirconium-based compounds. As the coupling agent, one or two or more of the above specific examples can be formulated.

(Fluidity Imparting Agent)

The fluidity imparting agent can suppress the reaction of a curing accelerator having no latent properties, such as a phosphorus atom-containing curing accelerator, when the resin composition is melt-kneaded. Thus, it is possible to improve the productivity of the resin composition for encapsulation.

Specific examples of the fluidity imparting agent include compounds in which a hydroxyl group is bonded to each of two or more adjacent carbon atoms constituting an aromatic ring, such as catechol, pyrogallol, gallic acid, gallic acid ester, 1,2-dihydroxynaphthalene, 2,3-dihydroxynaphthalene, and derivatives thereof.

(Release Agent)

Specific examples of the release agent include natural waxes such as carnauba wax; synthetic waxes such as montanic acid ester wax and oxidized polyethylene wax; higher fatty acids such as zinc stearate and metal salts thereof; paraffin; and carboxylic acid amides such as erucic acid amide. As the release agent, one or two or more of the above specific examples can be formulated.

(Ion Scavenger)

Specific examples of the ion scavenger include hydrotalcites such as hydrotalcite and hydrotalcite-like substances; and hydrous oxides of elements selected from magnesium, aluminum, bismuth, titanium and zirconium. As the ion scavenger, one or two or more of the above specific examples can be formulated.

(Curing Accelerator)

Specific examples of the curing accelerator include phosphorus atom-containing compounds such as onium salt compounds, organic phosphines, tetra-substituted phosphonium compounds, phosphobetaine compounds, adducts of a phosphine compound and a quinone compound, and adducts of a phosphonium compound and a silane compound; imidazole compounds such as 2-methylimidazole, 2-ethyl-4-methylimidazole (EMI 24), 2-phenyl-4-methylimidazole (2P4MZ), 2-phenylimidazole (2PZ), 2-phenyl-4-methyl-5-hydroxyimidazole (2P4MHZ), and 1-benzyl-2-phenylimidazole (1B2PZ); amidines and tertiary amines such as 1,8-diazabicyclo[5.4.0]undecene-7, and benzyldimethylamine; and nitrogen atom-containing compounds such as quaternary ammonium salts of the amidines or the tertiary amines. As the curing accelerator, one or two or more of the above specific examples can be formulated.

(Low Stress Agent)

Specific examples of the low stress agent include silicone compounds such as silicone oil and silicone rubber; polybutadiene compounds; acrylonitrile-butadiene copolymer compounds such as an acrylonitrile-carboxyl-terminated butadiene copolymer compound. As the low stress agent, one or two or more of the above specific examples can be formulated.

(Colorant)

Specific examples of the colorant include carbon black, red iron oxide, and titanium oxide. As the colorant, one or two or more of the above specific examples can be formulated.

(Flame Retardant)

Specific examples of the flame retardant include aluminum hydroxide, magnesium hydroxide, zinc borate, zinc molybdate, phosphazene, and carbon black. As the flame retardant, one or two or more of the above specific examples can be formulated.

(Method for Producing Resin Composition for Encapsulation)

Next, a method for producing a resin composition for encapsulation according to an embodiment will be described.

The method for producing a resin composition for encapsulation according to the embodiment includes, for example, a mixing step (S1) of mixing the above-mentioned raw material components to prepare a mixture, and then a molding step (S2) of molding the mixture.

(Mixing Step (S1))

The mixing step is a step of mixing raw material components to prepare a mixture. The mixing method is not limited, and a known method can be used depending on the components to be used.

In the mixing step, specifically, the raw material components included in the above-described resin composition for encapsulation are uniformly mixed using a mixer or the like. Next, the mixture is melt-kneaded with a kneader such as a roll, a kneader or an extruder to prepare a mixture.

(Molding Step (S2))

After the above-mentioned mixing step (S1), the molding step (S2) for molding the mixture is performed.

The molding method is not limited, and a known method can be used depending on the shape of the resin composition for encapsulation. The shape of the resin composition for encapsulation is not limited, and examples thereof include a granular shape, a powder shape, a tablet shape, and a sheet shape. The shape of the resin composition for encapsulation can be selected according to the molding method.

As a molding step of preparing a granular resin composition for encapsulation, for example, a step of pulverizing a cooled mixture after melt-kneading may be used. In addition, for example, the size of the granules may be adjusted by sieving the granular resin composition for encapsulation. Further, for example, the granular resin composition for encapsulation may be treated by a method such as a centrifugal milling method or a hot cut method to adjust the dispersity or fluidity.

In addition, as a molding step of preparing a powdery resin composition for encapsulation, for example, a step of pulverizing the mixture to obtain a granular resin composition and then further pulverizing the granular resin composition for encapsulation may be used.

Further, as a molding step of preparing a tablet resin composition for encapsulation, for example, a step of pulverizing the mixture into a granular resin composition for encapsulation, and then molding the granular resin composition for encapsulation into tablets may be used.

Further, as a molding step of preparing a sheet-like resin composition for encapsulation, for example, a step of extruding or calendering the mixture after melt-kneading.

(Semiconductor Device)

Next, a semiconductor device using the resin composition for encapsulation according to the embodiment will be described.

The semiconductor device according to the embodiment includes, for example, a semiconductor element that is mounted over a substrate, and an encapsulating member that encapsulates the semiconductor element. Furthermore, for example, the encapsulating member is constituted of a cured product of the resin composition for encapsulation obtained by the method for producing the resin composition for encapsulation.

The resin composition for encapsulation according to the embodiment is used as an encapsulating member that encapsulates the semiconductor element. A method for forming the encapsulating member is not limited, and examples thereof include a transfer molding method, a compression molding method, and injection molding. By these methods, the encapsulating member can be formed by molding and curing the resin composition for encapsulation.

The semiconductor element is not limited and includes an integrated circuit, a large scale integrated circuit, a transistor, a thyristor, a diode, and a solid state image sensor.

The base material is not limited and a wiring board such as an interposer, a lead frame, and the like may be used.

In a case where the electrical connection between the semiconductor element and the base material is required, the semiconductor element and the base material may be appropriately connected. The method of electrical connection is not limited, and examples thereof include wire bonding and flip chip connection.

A semiconductor device is obtained by forming an encapsulating member that encapsulates the semiconductor element with the resin composition for encapsulation. The semiconductor device is not limited, and the semiconductor device obtained by molding the semiconductor element is preferable.

As the kind of the semiconductor device, specifically, mold array package (MAP), quad flat package (QFP), small outline package (SOP), chip size package (CSP), quad flat non-leaded package (QFN), small outline non-leaded package (SON), ball grid array (BGA), lead flame BGA (LF-BGA), flip chip BGA (FCBGA), molded array process BGA (MAPBGA), embedded wafer-level BGA (eWLB), Fan-In type eWLB, and Fan-Out type eWLB.

Hereinafter, an example of the semiconductor device using the resin composition for encapsulation according to the embodiment will be described.

FIG. 1 is a cross-sectional view showing a semiconductor device 100 according to an embodiment.

The semiconductor device 100 of the embodiment includes an electronic element 20, a bonding wire 40 connected to the electronic element 20, and an encapsulating member 50, and the encapsulating member 50 is constituted of a cured product of the above-mentioned resin composition for encapsulation.

More specifically, the electronic element 20 is fixed over a base material 30 via a die attach material 10, and the semiconductor device 100 has an outer lead 34 connected to an electrode pad (not shown) provided over the electronic element 20 via the bonding wire 40. The bonding wire 40 can be set in consideration of the electronic element 20 to be used, and for example, a Cu wire can be used.

Hereinafter, a method for producing the semiconductor device using the resin composition for encapsulation according to the embodiment will be described.

The method for producing the semiconductor device according to the embodiment includes, for example, a production step of obtaining a resin composition for encapsulation by the above-mentioned method for producing the resin composition for encapsulation, a step of mounting an electronic element over a substrate, and a step of encapsulating the electronic element using the resin composition for encapsulation.

For example, the semiconductor device 100 is formed by the following method.

First, an electronic element is mounted on a substrate. Specifically, the die attach material 10 is used to fix the electronic element 20 over a die pad 32 (substrate 30), and the die pad 32 (base material 30) that is a lead frame is connected by the bonding wire 40. Thus, an object to be encapsulated is formed.

The semiconductor device 100 is produced by encapsulating this object to be encapsulated using the resin composition for encapsulation, and forming the encapsulating member 50.

In the semiconductor device 100 in which the electronic element 20 is encapsulated, as necessary, the resin composition for encapsulation is cured at a temperature of about 80° C. to 200° C. for a period of time of about 10 minutes to 10 hours and then an electronic device is mounted.

Although the present invention has been described above based on the embodiment, the present invention is not limited to the above embodiment, and the configuration can be changed without departing from the scope of the present invention.

EXAMPLES

Hereinafter, the present invention will be described in detail with reference to examples, but the present invention is not limited to the description of these examples.

First, the raw material components used in the resin composition for encapsulation of each of Examples and Comparative Examples will be described.

(Epoxy Resin)

Epoxy resin 1: Phenol aralkyl type epoxy resin containing a biphenylene skeleton (NC-3000L, manufactured by Nippon Kayaku Co., Ltd.)

Epoxy resin 2: Bisphenol A type epoxy resin (YL6810, manufactured by Mitsubishi Chemical Corporation)

(Curing Agent)

Curing agent 1: Phenol aralkyl resin containing a biphenylene skeleton (GPH-65, manufactured by Nippon Kayaku Co., Ltd.)

(Carbon Black)

Carbon black 1: Carbon #5 manufactured by Mitsubishi Chemical Corporation was used as carbon black 1. The carbon black 1 had a primary particle diameter of 80 nm. In addition, the particle diameter $D_{50}$ (that is, the secondary particle diameter) at which the cumulative frequency of the volume-based particle size distribution of the aggregates of carbon black 1 was 50% was 200 μm.

Carbon black 2: ESR-2001 manufactured by Tokai Carbon Co., Ltd. was used as carbon black 2. The carbon black 2 had a primary particle diameter of 60 nm. In addition, the particle diameter $D_{50}$ (that is, the secondary particle diameter) at which the cumulative frequency of the volume-based particle size distribution of the aggregates of carbon black 2 was 50% was 200 μm.

(Inorganic Filler)

Inorganic filler 1: Spherical fine powder silica (SO-32R, manufactured by Admatechs Company Limited, particle diameter $D_{50}$ at which cumulative frequency of volume-based particle size distribution is 50%=1.5 μm, specific surface area: 5.5 m$^2$/g, Mohs hardness: 7)

Inorganic filler 2: Fused spherical silica (TS-3100, manufactured by Micron Technology, Inc., particle diameter $D_{50}$ at which cumulative frequency of volume-based particle size distribution is 50%=2.5 μm, specific surface area: 7.5 m$^2$/g, Mohs hardness: 7)

Inorganic filler 3: Fused spherical silica (FB-560, manufactured by Denka Company Limited, particle diameter $D_{50}$ at which cumulative frequency of volume-based particle size distribution is 50%=30 μm, specific surface area: 1.3 m$^2$/g, Mohs hardness: 7)

Inorganic filler 4: Alumina (DAB-30FC, manufactured by Denka Company Limited, particle diameter $D_{50}$ at which cumulative frequency of volume-based particle size distribution is 50%=13 μm, specific surface area: 1.4 m$^2$/g, Mohs hardness: 9)

Inorganic filler 5: Aluminum hydroxide (CL-303, manufactured by Sumitomo Chemical Co., Ltd., particle diameter $D_{50}$ at which cumulative frequency of volume-based particle size distribution is 50%=5 μm, specific surface area: 1.0 m$^2$/g, Mohs hardness: 3)

Inorganic filler 6: Fused spherical silica (FB-950, manufactured by Denka Company Limited, particle diameter $D_{50}$ at which cumulative frequency of volume-based particle size distribution is 50%=23 μm, specific surface area: 1.5 m$^2$/g)

(Coupling Agent)

Coupling agent 1: 3-mercaptopropyltrimethoxysilane (S810, manufactured by Chisso Corporation)

(Curing Accelerator)

Curing accelerator 1: An adduct of a phosphonium compound represented by the following formula (P1) and a silane compound was synthesized and used as a curing accelerator 1. The synthesis method will be described in detail below.

First, in a flask containing 1800 g of methanol, 249.5 g of phenyltrimethoxysilane, and 384.0 g of 2,3-dihydroxynaphthalene were added and dissolved, and then 231.5 g of a 28% sodium methoxide methanol solution was added dropwise under stirring at room temperature. Next, a solution obtained by dissolving 503.0 g of tetraphenylphosphonium bromide in 600 g of methanol was added dropwise into the flask under stirring at room temperature to precipitate crystals. The precipitated crystals were filtered, washed with water, and vacuum dried to obtain a curing accelerator 1 which was a pink white crystal of an adduct of a phosphonium compound and a silane compound.

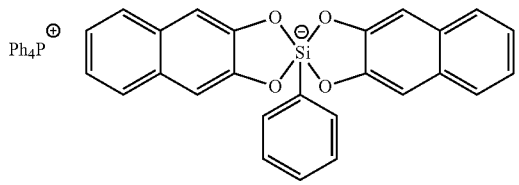

(P1)

(Release Agent)

Release agent 1: Montanic acid ester wax (LICOLUB WE-4, manufactured by Clariant)

Resin compositions for encapsulation of Examples 1 to 10 and Comparative Example 1 were prepared using the raw material components described above. The details will be described below.

Example 1

First, the carbon black according to Example 1 was pulverized. The pulverization of carbon black was performed using the carbon black 1 and the inorganic filler 1 in the formulation amounts (parts by mass) shown in Table 1 below.

Specifically, first, the carbon black 1 was subjected to first jet mill pulverization using an air flow type jet mill (feed amount: 10 kg/hour, air pressure: 0.45 MPa). The particle diameter $D_{50}$ (that is, the secondary particle diameter) at which the cumulative frequency of the volume-based particle size distribution of the aggregates of the carbon black 1 subjected to the first jet mill pulverization was 50% was 10 μm.

Next, the carbon black 1 subjected to the first jet mill pulverization and the inorganic filler 1 were mixed to prepare a mixture.

Next, the mixture was subjected to second jet mill pulverization using an air flow type jet mill (feed amount: 50 kg/hour, air pressure: 0.45 MPa) to obtain fine particles of the carbon black 1. The particle diameter $D_{50}$ (that is, the secondary particle diameter) at which the cumulative frequency of the volume-based particle size distribution of the aggregates of the fine particles of the carbon black 1 of Example 1 was 50% was 3 μm.

Then, the fine particles of the carbon black 1, the inorganic filler 1 used for the pulverization, and the raw material components other than those used in the production of the fine particles of the carbon black 1 were mixed in the formulation amounts shown in Table 1 below at room temperature using a mixer and then biaxially kneaded at a temperature of 70° C. or higher and 100° C. or lower. Then, the mixture was cooled to room temperature and then pulverized to obtain a resin composition for encapsulation of Example 1.

Examples 2 to 4

Resin compositions for encapsulation of Examples 2 to 4 were prepared in the same manner as in the preparation of the resin composition for encapsulation of Example 1 except that the formulation amounts of the respective components were changed as shown in Table 1 below.

The particle diameter $D_{50}$ (that is, the secondary particle diameter) at which the cumulative frequency of the volume-based particle size distribution of the aggregates of the carbon black fine particles of each of Examples 2 to 4 is 50% is shown in Table 1 below. The unit is μm.

Example 5

A resin composition for encapsulation of Example 5 was prepared in the same manner as in the preparation of the resin composition for encapsulation of Example 1 except that the formulation amounts of the respective components were changed as shown in Table 1 below, and further, only the second jet mill pulverization was performed without performing the first jet mill pulverization on the carbon black 1 to prepare fine particles of pulverized carbon black 1. The particle diameter $D_{50}$ (that is, the secondary particle diameter) at which the cumulative frequency of the volume-based particle size distribution of the aggregates of carbon black fine particles of Example 5 was 50% was 5 μm.

Example 6

A resin composition for encapsulation of Example 6 was prepared in the same manner as in the preparation of the resin composition for encapsulation of Example 5 except that the pulverization of carbon black was performed using the carbon black 2 and the inorganic filler 1, and further the formulation amounts of the respective components were changed as shown in Table 1 below. The particle diameter $D_{50}$ (that is, the secondary particle diameter) at which cumulative frequency of the volume-based particle size distribution of the aggregates of carbon black fine particles of Example 6 was 50% was 3 μm.

Example 7

A resin composition for encapsulation of Example 7 was prepared in the same manner as in the preparation of the resin composition for encapsulation of Example 1 except that the formulation amounts of the respective components were changed as shown in Table 1 below, and the carbon black 1 and the inorganic filler 2 were used to prepare pulverized carbon black 1 according to Example 7.

Example 8

A resin composition for encapsulation of Example 8 was prepared in the same manner as in the preparation of the resin composition for encapsulation of Example 1 except that the formulation amounts of the respective components were changed as shown in Table 1 below, and the carbon black 1 and the inorganic filler 3 were used to prepare pulverized carbon black according to Example 8.

Example 9

A resin composition for encapsulation of Example 9 was prepared in the same manner as in the preparation of the resin composition for encapsulation of Example 1 except that the formulation amounts of the respective components were changed as shown in Table 1 below, and the carbon black 1 and the inorganic filler 4 were used to prepare pulverized carbon black according to Example 9.

Example 10

A resin composition for encapsulation of Example 10 was prepared in the same manner as in the preparation of the resin composition for encapsulation of Example 1 except that the formulation amounts of the respective components were changed as shown in Table 1 below, and the carbon black 1 and the inorganic filler 5 were used to prepare pulverized carbon black according to Example 10.

The particle diameter $D_{50}$ (that is, the secondary particle diameter) at which the cumulative frequency of the volume-based particle size distribution of the aggregates of the carbon black fine particles of each of Examples 7 to 10 is 50% is shown in Table 1 below. The unit is μm.

Comparative Example 1

The respective components in the formulation amounts shown in Table 1 below were mixed at room temperature using a mixer, and then biaxially kneaded at a temperature of 70° C. to 100° C. Then, the mixture was cooled to room temperature and then pulverized to obtain a resin composition for encapsulation of Comparative Example 1.

<Evaluation>

The following evaluations were performed on the resin compositions for encapsulation of Examples 1 to 10 and Comparative Example 1.

(Maximum Particle Diameter of Carbon Aggregate)

Regarding the cured products of the resin compositions for encapsulation according to Examples 1 to 10 and Comparative Example 1, the number of aggregates of carbon black fine particles (carbon black aggregates) having a particle diameter of more than 25 μm included in the resin compositions for encapsulation, and the maximum particle diameter of the carbon black aggregate were evaluated.

First, using a low pressure transfer molding machine, the resin compositions for encapsulation of Examples 1 to 10 and Comparative Example 1 were injection-molded under the conditions of a mold temperature of 175° C., an injection pressure of 10 MPa, and a curing time of 120 seconds to have a diameter of 100 mm and a thickness of 2 mm, and thus cured products were obtained. The surface of each cured product was observed with a fluorescence microscope, and the number of carbon black aggregates whose particle diameter was larger than 25 μm was counted. The carbon black aggregate whose particle diameter is larger than 25 μm means that the maximum length when connecting any two points in a certain carbon black aggregate is larger than 25 μm. The evaluation results are shown in Table 1 below as "Number of carbon black aggregates (particle diameter of more than 25 μm)". The unit is "piece". Further, the surface of the cured product was observed with a fluorescence microscope to measure the maximum particle diameter of the carbon black aggregate. The results are shown in Table 1. The unit is μm. The maximum particle diameter of the carbon black aggregates is the maximum value of the particle diameter of the carbon aggregates. The particle diameter of the carbon black aggregates was measured by taking the maximum length when two arbitrary points in a certain carbon aggregate are connected as the particle diameter.

(High Temperature Leak Characteristics)

Semiconductor devices were prepared using the resin compositions for encapsulation of Examples 1 to 10 and Comparative Example 1, and the high temperature leak characteristics were evaluated as the electrical reliability of the semiconductor devices. The details are shown below.

First, each of the resin compositions for encapsulation of Examples 1 to 10 and Comparative Example 1 was injection-molded using a low pressure transfer molding machine (Y series, manufactured by IOWA Corporation) under the conditions of a mold temperature of 175° C., an injection pressure of 6.9 MPa, and a holding time of 90 seconds to encapsulate and mold a 352-pin BGA, and the resin composition was post-cured at 175° C. for 4 hours. Next, with respect to 100 352-pin BGAs, a leak current at 175° C. was measured using a micro ammeter 8240A manufactured by ADVANTEST Co., Ltd., and the high temperature leak characteristics were evaluated. The evaluation criteria are as follows.

A: No leak current was detected for all 100 352-pin BGAs.

B: A leak current was detected for one or more 352-pin BGAs.

TABLE 1

| | | | Example 1 | Example 2 | Example 3 | Example 4 | Example 5 | Example 6 |
|---|---|---|---|---|---|---|---|---|
| Resin composition for encapsulation | Epoxy resin | Epoxy resin 1 | 2.810 | 2.810 | 2.810 | 2.810 | 2.810 | 2.810 |
| | | Epoxy resin 2 | 2.810 | 2.810 | 2.810 | 2.810 | 2.810 | 2.810 |

TABLE 1-continued

| | | | | | | | | |
|---|---|---|---|---|---|---|---|---|
| [parts by mass] | Curing agent | Curing agent 1 | 4.350 | 4.350 | 4.350 | 4.350 | 4.350 | 4.350 |
| | Carbon black | Carbon black 1 | 0.330 | 0.300 | 0.300 | 0.297 | 0.330 | — |
| | | Carbon black 2 | — | — | — | — | — | 0.330 |
| | Inorganic filler | Inorganic filler 1 | 2.970 | 1.200 | 0.300 | 0.033 | 2.970 | 2.970 |
| | | Inorganic filler 2 | — | — | — | — | — | — |
| | | Inorganic filler 3 | — | — | — | — | — | — |
| | | Inorganic filler 4 | — | — | — | — | — | — |
| | | Inorganic filler 5 | — | — | — | — | — | — |
| | | Inorganic filler 6 | 85.700 | 87.500 | 88.400 | 88.670 | 85.700 | 85.700 |
| | Coupling agent | Coupling agent 1 | 0.300 | 0.300 | 0.300 | 0.300 | 0.300 | 0.300 |
| | Curing accelerator | Curing accelerator 1 | 0.380 | 0.380 | 0.380 | 0.380 | 0.380 | 0.380 |
| | Release agent | Release agent 1 | 0.350 | 0.350 | 0.350 | 0.350 | 0.350 | 0.350 |
| | | Total | 100.000 | 100.000 | 100.000 | 100.000 | 100.000 | 100.000 |
| Evaluation results | $D_{50}$ of carbon black aggregates [μm] | | 3 | 3 | 4 | 5 | 5 | 3 |
| | Number of carbon black aggregates (particle diameter of more than 25 μm) [piece] | | 0 | 0 | 0 | 0 | 0 | 0 |
| | Maximum particle diameter of carbon black aggregates [μm] | | 14 | 14 | 18 | 19 | 18 | 13 |
| | High temperature leak characteristics | | A | A | A | A | A | A |

| | | | Example 7 | Example 8 | Example 9 | Example 10 | Comparative Example 1 |
|---|---|---|---|---|---|---|---|
| Resin composition for encapsulation [parts by mass] | Epoxy resin | Epoxy resin 1 | 2.810 | 2.810 | 2.810 | 2.810 | 2.810 |
| | | Epoxy resin 2 | 2.810 | 2.810 | 2.810 | 2.810 | 2.810 |
| | Curing agent | Curing agent 1 | 4.350 | 4.350 | 4.350 | 4.350 | 4.350 |
| | Carbon black | Carbon black 1 | 0.330 | 0.330 | 0.330 | 0.330 | 0.300 |
| | | Carbon black 2 | — | — | — | — | — |
| | Inorganic filler | Inorganic filler 1 | — | — | — | — | — |
| | | Inorganic filler 2 | 2.970 | — | — | — | — |
| | | Inorganic filler 3 | — | 2.970 | — | — | — |
| | | Inorganic filler 4 | — | — | 2.970 | — | — |
| | | Inorganic filler 5 | — | — | — | 2.970 | — |
| | | Inorganic filler 6 | 85.700 | 85.700 | 85.700 | 85.700 | 88.700 |
| | Coupling agent | Coupling agent 1 | 0.300 | 0.300 | 0.300 | 0.300 | 0.300 |
| | Curing accelerator | Curing accelerator 1 | 0.380 | 0.380 | 0.380 | 0.380 | 0.380 |
| | Release agent | Release agent 1 | 0.350 | 0.350 | 0.350 | 0.350 | 0.350 |
| | | Total | 100.000 | 100.000 | 100.000 | 100.000 | 100.000 |
| Evaluation results | $D_{50}$ of carbon black aggregates [μm] | | 3 | 5 | 3 | 4 | 200 |
| | Number of carbon black aggregates (particle diameter of more than 25 μm) [piece] | | 0 | 0 | 0 | 0 | 5 |
| | Maximum particle diameter of carbon black aggregates [μm] | | 15 | 16 | 15 | 18 | 55 |
| | High temperature leak characteristics | | A | A | A | A | B |

As shown in Table 1, it was confirmed that the resin compositions for encapsulation of Examples 1 to 10 were superior to the resin composition for encapsulation of Comparative Example 1 in electrical reliability when semiconductor devices were produced.

This application claims priority based on Japanese Patent Application No. 2018-018871 filed on Feb. 6, 2018 and Japanese Patent Application No. 2018-018872 filed on Feb. 6, 2018, the entire disclosures of which are incorporated herein.

The invention claimed is:

1. A method for producing a resin composition for encapsulating semiconductor, the method comprising:
   a step of pre-pulverizing a carbon black alone by jet milling;
   a step of mixing the pre-pulverized carbon black and an inorganic filler to obtain a mixture, and pulverizing the mixture by jet milling to pulverize the pre-pulverized carbon black so as to obtain a mixture of the inorganic filler and carbon black fine particles,
   wherein a particle diameter $D_{50}$ at which a cumulative frequency of a volume-based particle size distribution of aggregates of the pre-pulverized carbon black in the mixture is 50% is 6 µm or more and 500 µm or less; and
   wherein when the $D_{50}$ of the pre-pulverized carbon black is set as A, a particle diameter $D_{50}$ at which a cumulative frequency of a volume-based particle size distribution of the inorganic filler in the mixture is 50% is set as B, A/B is 0.1 or more and 200 or less; and
   a step of mixing an epoxy resin and a curing agent with the mixture of the inorganic filler and the carbon black fine particles to obtain the resin composition for encapsulating semiconductor.

2. The method for producing a resin composition for encapsulating semiconductor according to claim 1, wherein a content of the inorganic filler in the mixture is 5 parts by mass or more and 2000 parts by mass or less with respect to 100 parts by mass of the carbon black.

3. The method for producing a resin composition for encapsulating semiconductor according to claim 1, wherein the inorganic filler in the mixture is one or more selected from the group consisting of inorganic oxides, inorganic nitrides, inorganic carbides, and inorganic hydroxides.

4. The method for producing a resin composition for encapsulating semiconductor according to claim 1, wherein the inorganic filler in the mixture has a Mohs hardness of 2 or more and 10 or less.

5. The method for producing a resin composition for encapsulating semiconductor according to claim 1, wherein the inorganic filler in the mixture is one or more selected from the group consisting of silica, alumina, and aluminum hydroxide.

6. The method for producing a resin composition for encapsulating semiconductor according to claim 1, wherein a particle diameter $D_{50}$ at which a cumulative frequency of a volume-based particle size distribution of aggregates of the carbon black fine particles is 50% is 0.01 µm or more and 25 µm or less.

* * * * *